(12) United States Patent
Li et al.

(10) Patent No.: US 7,646,551 B2
(45) Date of Patent: Jan. 12, 2010

(54) MICROLENSES WITH PATTERNED HOLES TO PRODUCE A DESIRED FOCUS LOCATION

(75) Inventors: Jin Li, Meridian, ID (US); Jiutao Li, Boise, ID (US); Ulrich Boettiger, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

(21) Appl. No.: 11/987,868

(22) Filed: Dec. 5, 2007

(65) Prior Publication Data

US 2009/0147379 A1    Jun. 11, 2009

(51) Int. Cl.
G02B 3/00 (2006.01)

(52) U.S. Cl. .................... 359/741; 359/652; 359/796
(58) Field of Classification Search ................ 359/652, 359/665, 666, 737, 738, 741, 796
See application file for complete search history.

(56) References Cited

U.S. PATENT DOCUMENTS

| | | | |
|---|---|---|---|
| 5,877,492 A * | 3/1999 | Fujieda et al. | ............ 250/208.1 |
| 6,495,813 B1 | 12/2002 | Fan et al. | |
| 6,916,584 B2 | 7/2005 | Sreenivasan et al. | |
| 7,068,432 B2 | 6/2006 | Boettiger et al. | |
| 7,129,176 B2 | 10/2006 | Oohara et al. | |
| 7,145,725 B2 | 12/2006 | Hasei et al. | |
| 2006/0060564 A1 | 3/2006 | Steinberg et al. | |
| 2006/0139763 A1* | 6/2006 | Satzke | ............. 359/652 |
| 2006/0289956 A1 | 12/2006 | Boettiger et al. | |
| 2007/0102842 A1 | 5/2007 | Naniwa et al. | |
| 2007/0238296 A1 | 10/2007 | Shimizu | |

OTHER PUBLICATIONS

Chronis, Nikolas et al., "Tunable liquid-filled microlens array integrated with microfluidic network", Berkeley Sensor and Actuator Center, Department of Bioengineering University of California at Berkeley, Berkeley, CA, vol. 11, No. 19, Optics Express 2377, Sep. 22, 2003, vvww.opticsexpress.orq/viewmedia.cfm?is=74372&seq=0.

* cited by examiner

Primary Examiner—Darryl J Collins
(74) Attorney, Agent, or Firm—Dickstein Shapiro LLP

(57) ABSTRACT

A method, apparatus and system providing a microlens having a substantially flat upper surface and having a plurality of holes arranged in a pattern in a microlens material which produces a focal point at a desired location.

25 Claims, 13 Drawing Sheets

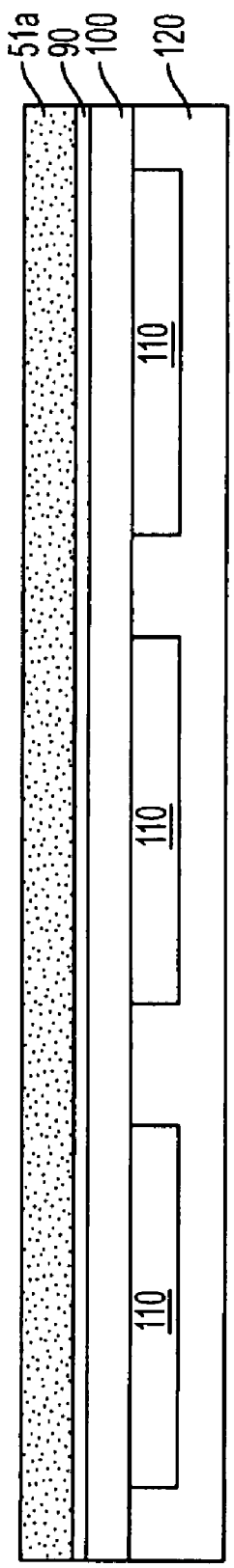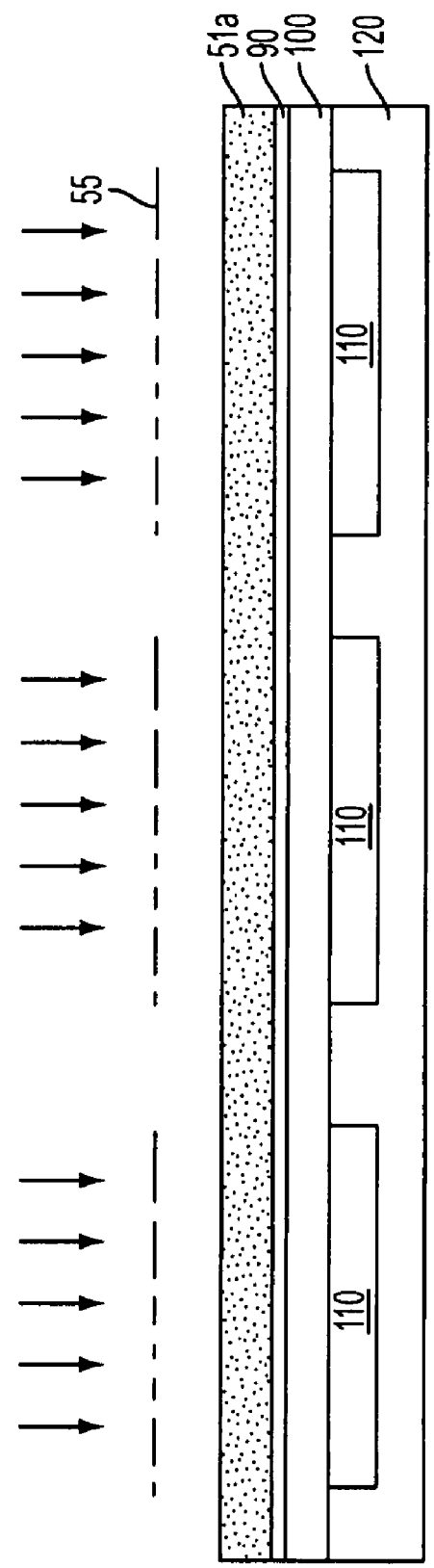

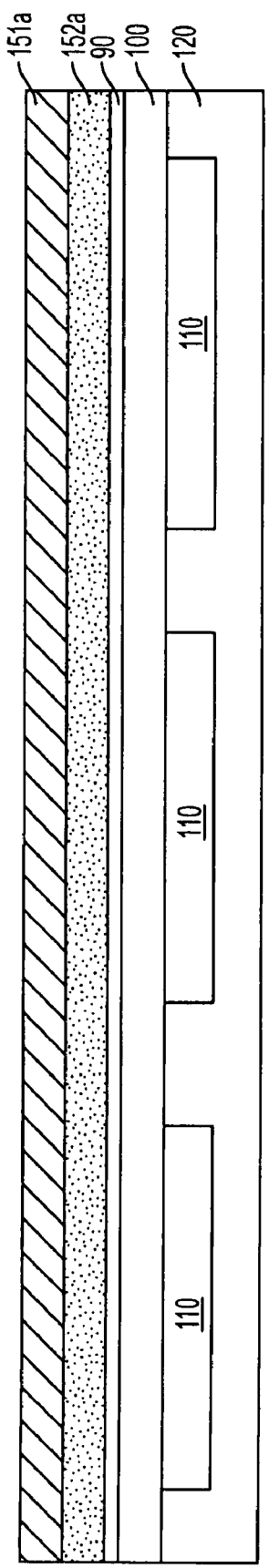
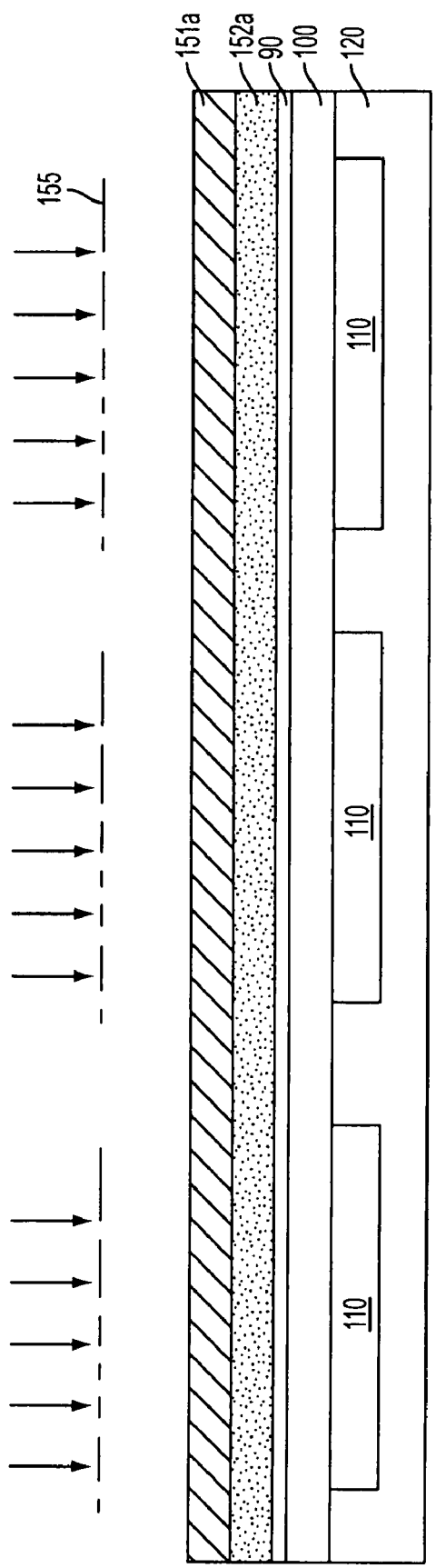

US 7,646,551 B2

MICROLENSES WITH PATTERNED HOLES TO PRODUCE A DESIRED FOCUS LOCATION

FIELD OF THE INVENTION

Embodiments relate to a method, apparatus and system for forming microlenses.

BACKGROUND

A solid state imager includes a focal plane array of pixel cells, each one of the cells including a photoconversion device, for example, a photogate, photoconductor, or a photodiode for accumulating photo-generated charge. Several different types of imagers are known, for example, CCD, CMOS and others. Almost all solid state imagers include a microlens array having individual lenses which respectively focus light on the photoconversion device of the pixel cells.

The microlenses help increase optical efficiency and reduce cross talk among pixel cells. As the resolution of the pixel cell array increases, there is a corresponding reduction of the size of the pixel cells arranged in a specific pixel cell array. Likewise, the size of the individual lenses in the microlens array also decreases.

It is important that a microlens focal point coincide with the part of an underlying photoconversion device which provide the greatest conversion efficiency of incoming photon to electrical charges. Accordingly, microlenses are arranged to have the focal point coincide with the center of a pixel cell. However, in some instances this may not coincide with the location of the photoconversion device or the portion of the photoconversion device having the greatest charge conversion efficiency.

BRIEF DESCRIPTION OF THE DRAWINGS

FIG. 3b is a diagram showing a pattern of hole rectangles for the microlens of FIG. 3a.

FIGS. 5a, 5b, 5c, and 5d illustrate a method of forming a portion of an imager array and microlens as shown in FIG. 1.

FIGS. 6a, 6b, 6c, and 6d illustrate another method of forming a portion of an imager array and microlens as shown in FIG. 1.

DETAILED DESCRIPTION OF THE INVENTION

In the following detailed description, reference is made to the accompanying drawings which form a part hereof, and which illustrate specific embodiments. These embodiments are described in sufficient detail to enable those of ordinary skill in the art to make and use them. It is also understood that structural, logical, or procedural changes may be made to the specific embodiments disclosed herein.

The term "substrate" is to be understood as interchangeable and as including silicon, silicon-on-insulator (SOI) or silicon-on-sapphire (SOS), doped and undoped semiconductors, epitaxial layers of silicon supported by a base semiconductor foundation, and other semiconductor structures. Furthermore, when reference is made to a "substrate" in the following description, previous process steps may have been utilized to form regions, junctions or material layers in or on the base semiconductor structure or foundation. In addition, the semiconductor need not be silicon-based, but could be based on silicon-germanium, germanium, gallium arsenide, or other known semiconductor materials.

The term "pixel" refers to a photo-element unit cell containing a photosensor (i.e., photosensitive region) for converting electromagnetic radiation to an electrical signal. Although the invention is described below with reference to an image sensor, such as a CMOS imager, the invention has applicability to any solid state image sensor having pixel cells. The following detailed description is, therefore, not to be taken in a limiting sense, and the scope of the present invention is defined only by the appended claims.

Figure 1A:
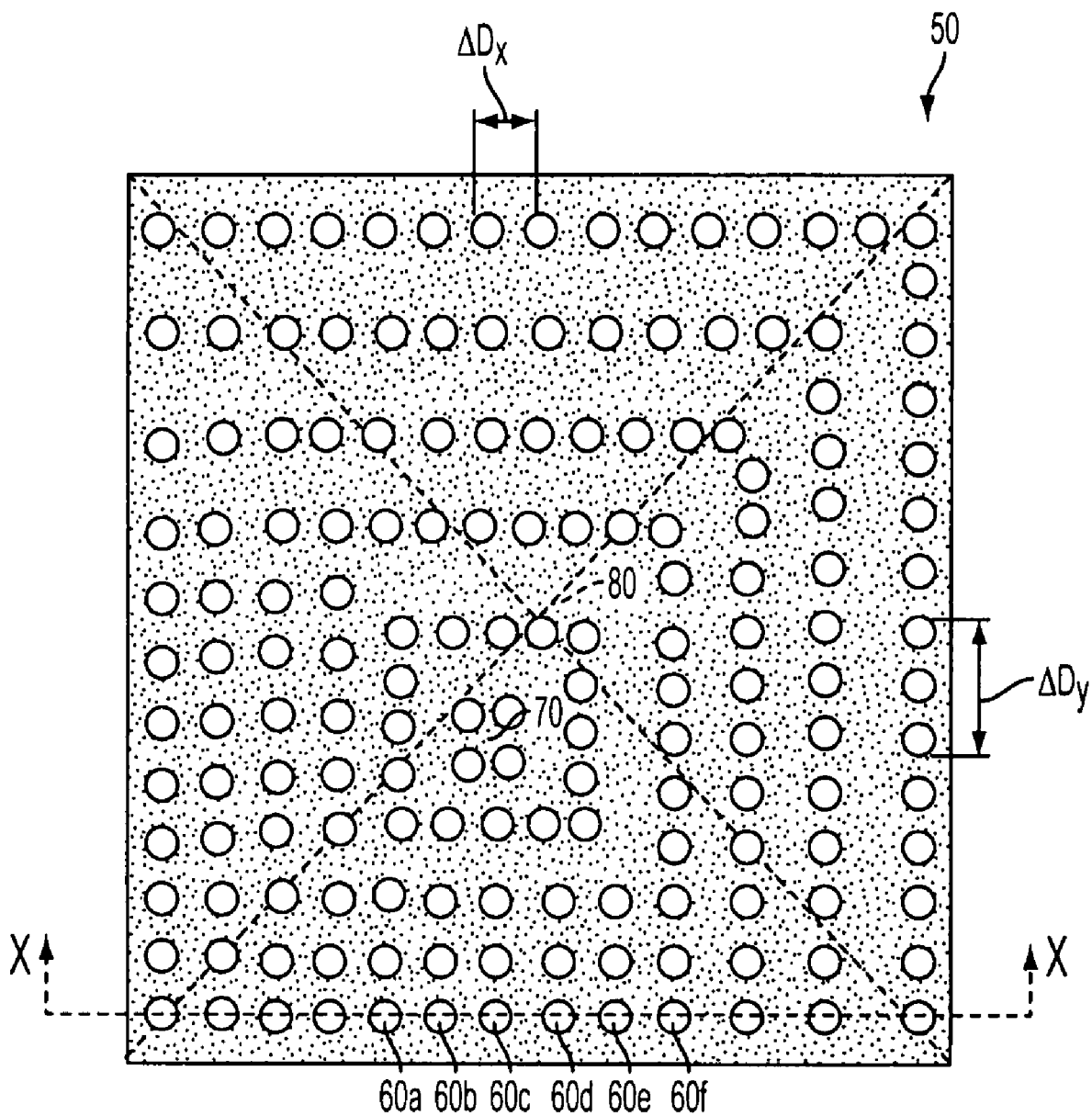
FIG. 1a is a top-down view of a microlens constructed in accordance with a first embodiment.
Figure 1B:
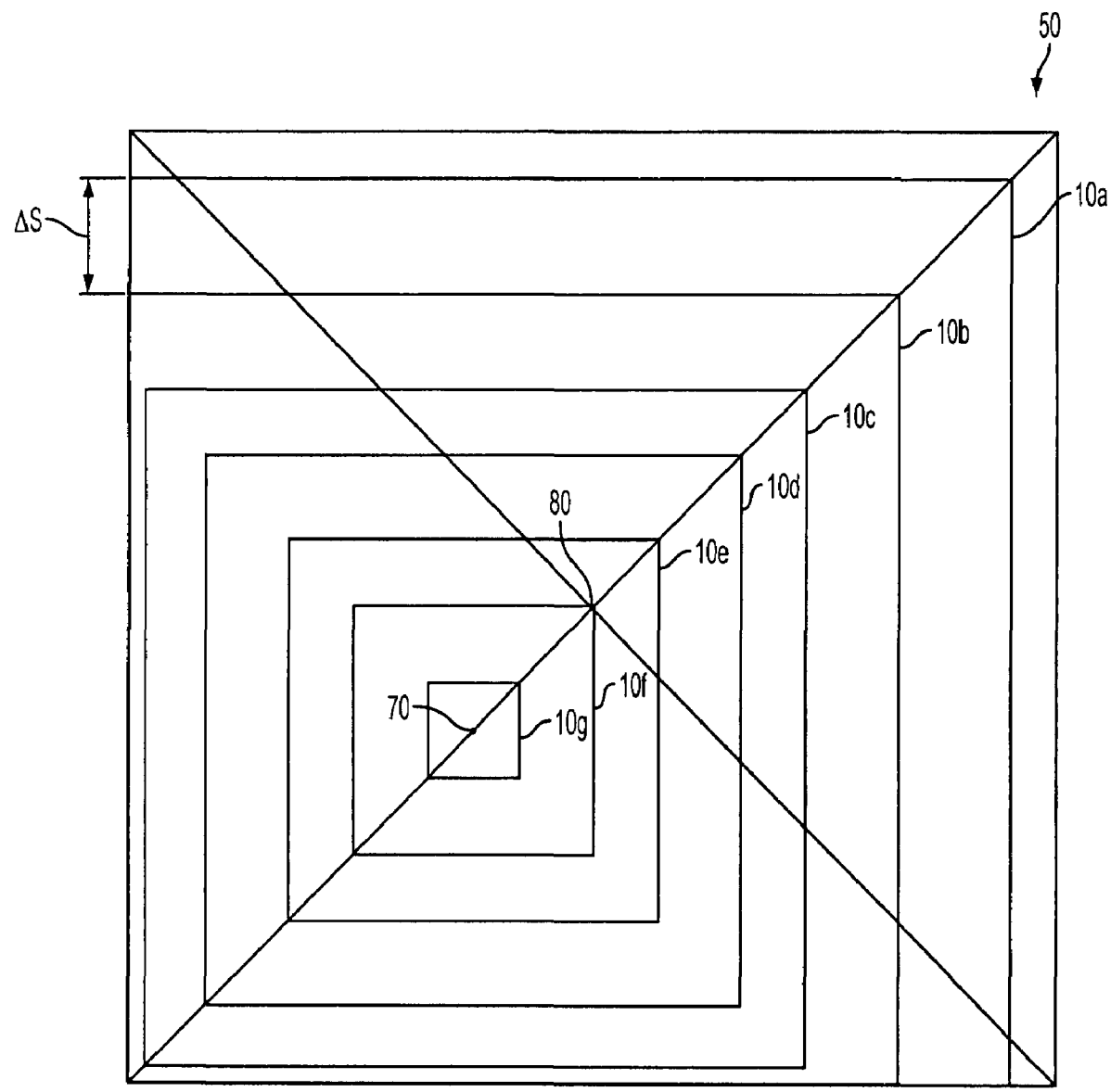
FIG. 1b is a diagram showing a pattern of hole rectangles for the microlens of FIG. 1a FIG. 2 is a cross-sectional view of the microlens of FIG. 1a above an imager pixel.

Referring now to FIG. 1a, a top-down view of an individual microlens 50 constructed in accordance with a first embodiment of the invention is shown. The microlens 50 includes a plurality of holes 60a, 60b, 60c, 60d, 60e, 60f, ( . . . 60n) formed in a pattern wherein the plurality of holes 60a, 60b, 60c, 60d, 60e, 60f are arranged in a pattern to form concentric rectangles having a common focal center 70 which lies on an axis of a focal point of the microlens 50. FIG. 1b shows an exemplary pattern of rectangles 10a, 10b, 10c, 10d, 10e, 10f, 10g. The focal center 70 is offset a predetermined distance $\Delta Dx$, $\Delta Dy$, from the geometric center 80 of the microlens 50. Each hole 60a, 60b, 60c, 60d, 60e, 60f (FIG. 1a) is approximately equal in diameter. The pattern of holes 60a, 60b, 60c, 60d, 60e, 60f is formed such that the width of each concentric rectangle increase from the focal center 70 towards the edge of the microlens 50, resulting in a change in density of holes 60a, 60b, 60c, 60d, 60e, 60f in the direction of a line drawn from the lower left corner towards the upper right corner, where density is equal to the number of holes present in a square unit of surface area of the microlens 50. In this embodiment, the hole density increases from the lower left corner to the focal center 70, then decreases from the focal center 70 to the upper right corner. Although illustrated in a substantially square shape, the microlens 50 may be formed in a circular or other shape. The holes 60a, 60b, 60c, 60d, 60e, 60f may be filled with air, some other gas or a filler material. Due in part to the pattern of the holes 60a, 60b, 60c, 60d, 60e, 60f, incoming light is focused toward focal center 70 of a microlens 50 instead of toward the geometric center 80, as will be further explained below.

Figure 2:
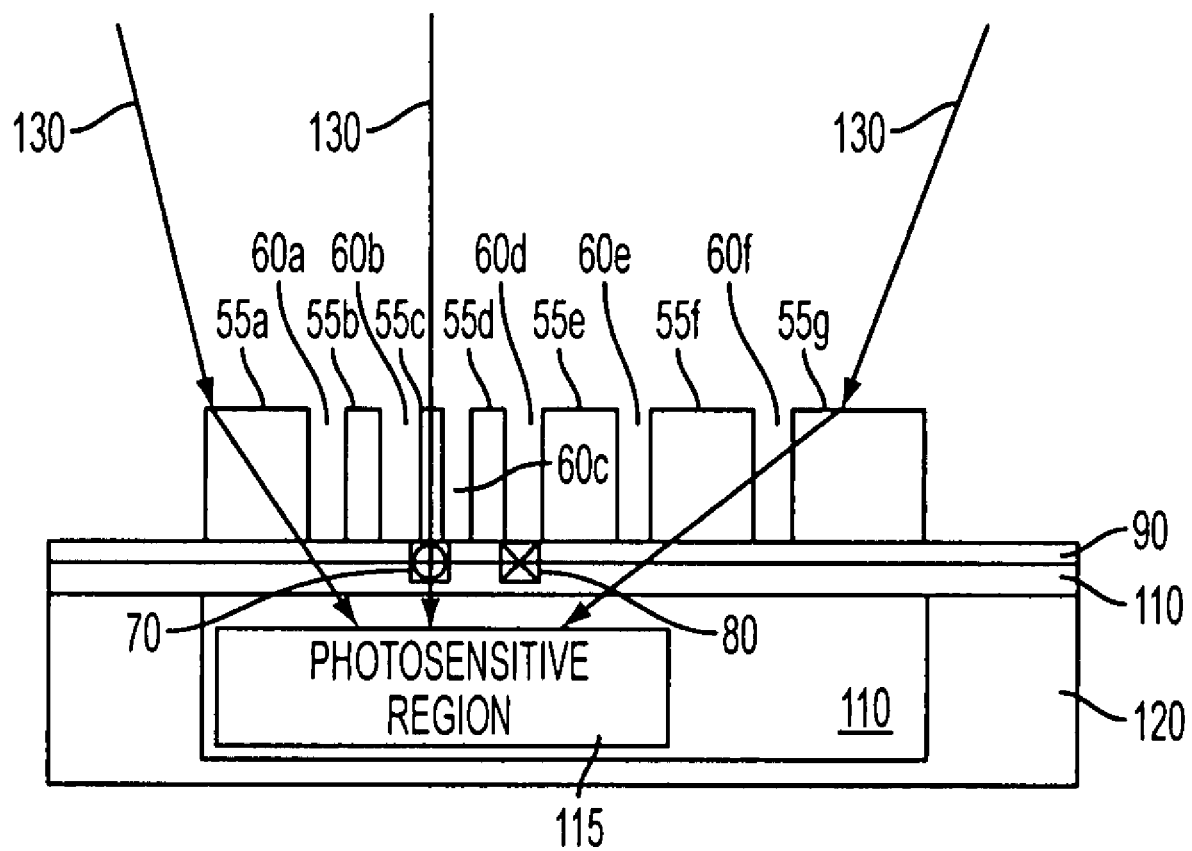

FIG. 2 shows a cross-sectional view of the microlens 50 of FIG. 3 along line X-X of FIG. 1a. The microlens 50 has a flat upper surface with a plurality of holes 60a, 60b, 60c, 60d, 60e, 60f. The radii of the holes 60a, 60b, 60c, 60d, 60e, 60f are approximately equal to one another. The microlens 50 is formed over a passivation layer 90, intervening layers 100 comprising a plurality of imager layers such as a color filter and metallization layers, and an imaging pixel 110 associated with a semiconductor substrate 120. Each pixel 110 has a photosensor 115 (i.e., photosensitive region) for converting photons to electrical charges.

The light collection efficiency of each pixel 110 is increased by the plurality of holes 60a, 60b, 60c, 60d, 60e, 60f in each microlens 50, which focuses a substantial amount of incident light 130 onto the photosensitive region 115 in the pixel 110, particularly on locations having the greatest photoconversion efficiency The various cross-sectional widths 55a, 55b, 55c, 55d, 55e, 55f, 55g of the lens material 55 in between the holes 60a, 60b, 60c, 60d, 60e, 60f introduce an average refractive index reduction from the edge (55a or 55g) of the microlens 50 towards the focal center 70. The average refractive index is based on the refractive index of the material which fills the holes 60a, 60b, 60c, 60d, 60e, 60f in relation to the refractive index of the lens material 55 used to fabricate the microlens 50. The material used to fill the holes 60a, 60b, 60c, 60d, 60e, 60f could be air or some other material having a lower refractive index from that of the lens material 55. If the filling material is air, the average refractive index will be higher when incident light 130 impinges upon an area of the microlens 50 with more lens material than air. Inversely, the average refractive index will be lower when incident light 130 impinges upon an area of the microlens 50 with more air than lens material. As a result of the differential refractive index, incident light 130, shown in FIG. 2 will pass substantially in a direction toward the focal center 70 of the microlens 50 to the photosensitive region 115 of the pixel 110 instead of the geometric center 80 of the microlens. Light 130 entering closer to the edge of the microlens 50, will bend toward the photosensitive region. The amount of bending of light 130 depends upon the change in value of the average refractive index from the focal center 70 to the edge (55a or 55g) of the microlens 50.

Figure 3A:
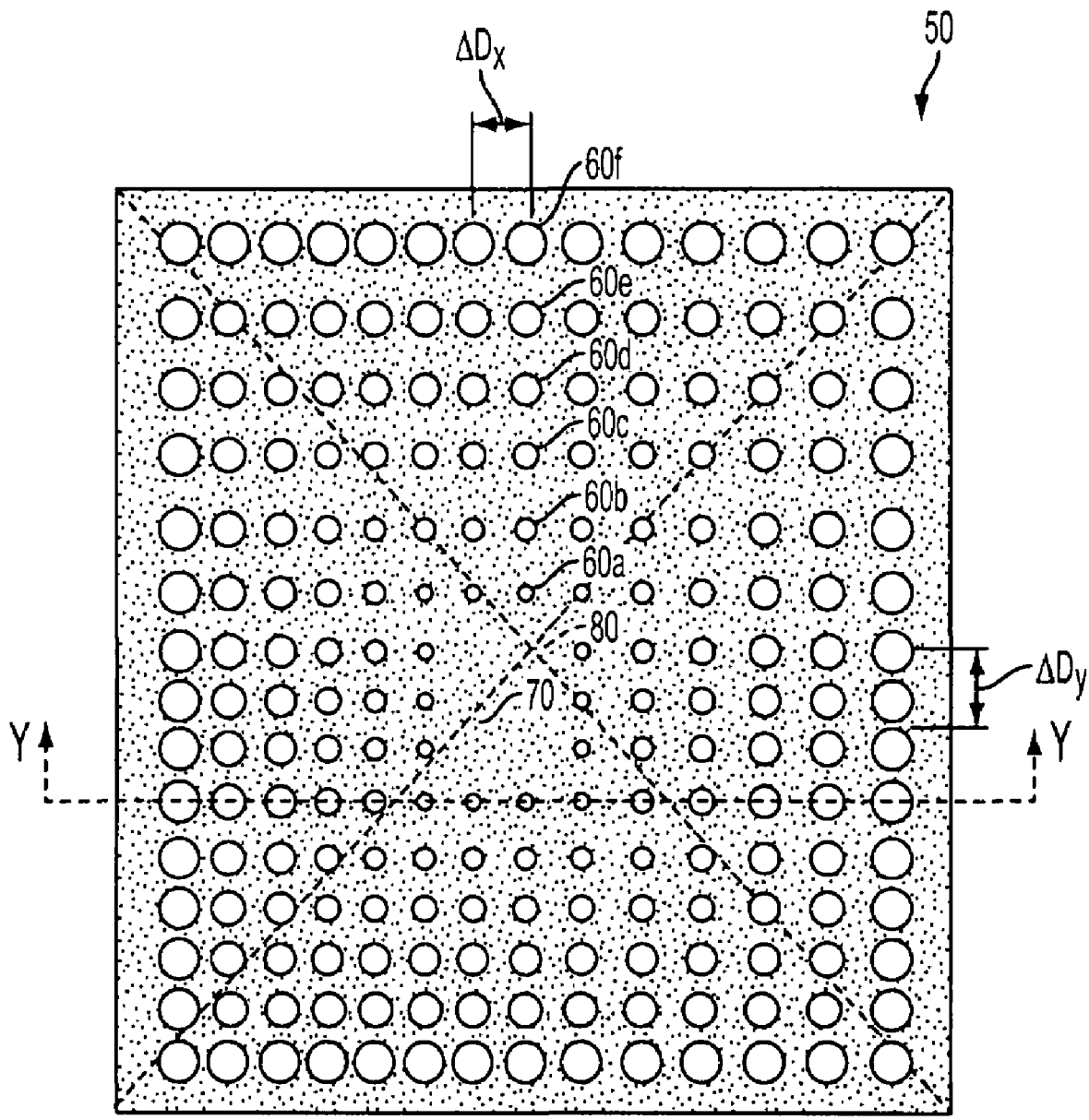
FIG. 3a is a top-down view of a microlens constructed in accordance with a second embodiment.
Figure 3B:
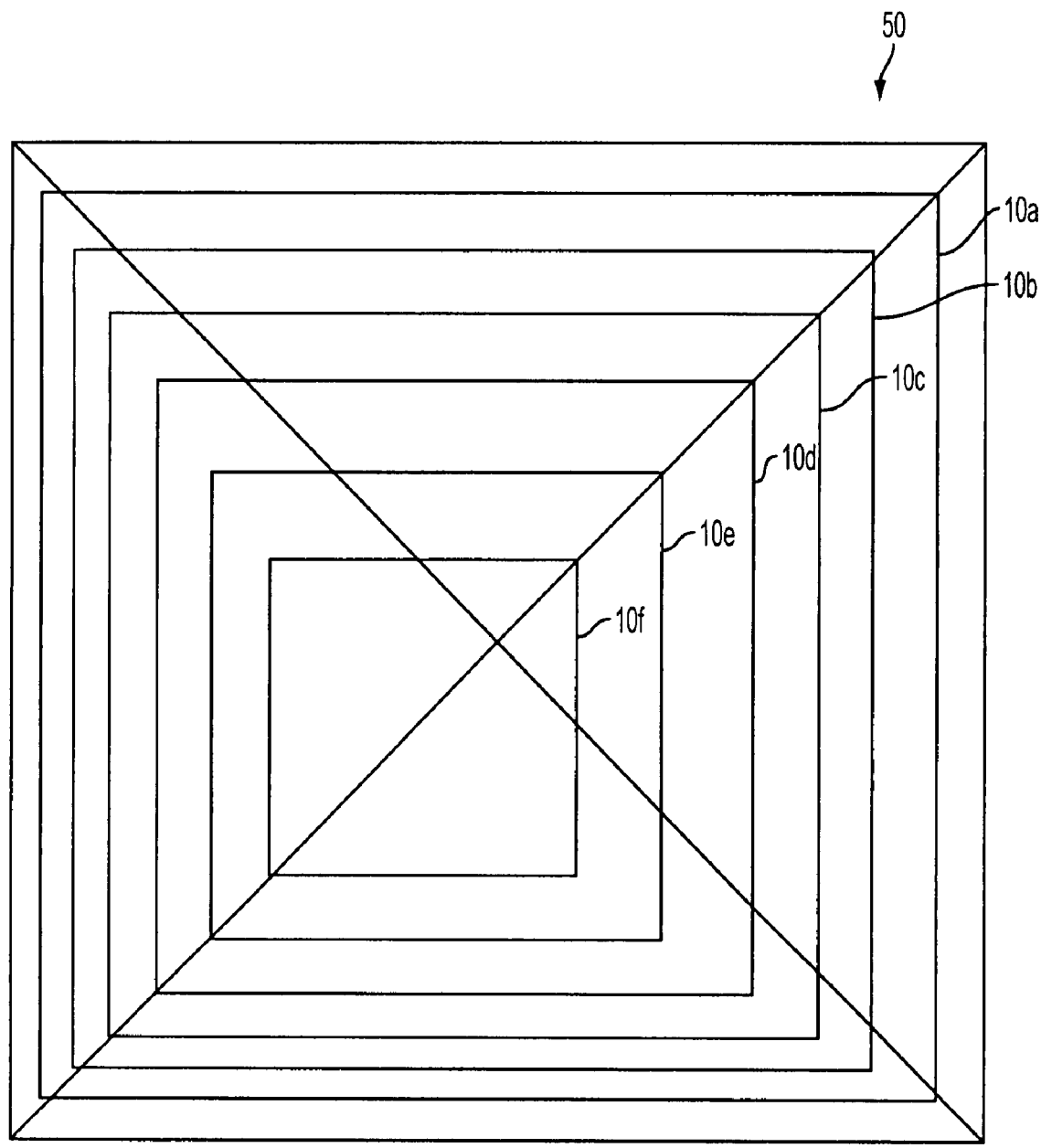

FIG. 3a shows a top view of a second embodiment of a microlens 50. The microlens 50 includes a plurality of holes 60a, 60b, 60c, 60d, 60e, 60f of varying radii. The holes 60a, 60b, 60c, 60d, 60e, 60f are arranged in a pattern of concentric rectangles having a common focal center 70. In this embodiment, the radii of the holes 65a, 65b, 65c progressively increase from the common focal center 70 in a direction toward the microlens 50 edges. The density of holes 60a, 60b, 60c, 60d, 60e, 60f remains substantially unchanged, with the exception of the absence of holes in the area immediately surrounding the focal center 70. FIG. 3b shows an exemplary pattern of rectangles 10a, 10b, 10c, 10d, 10e, 10f proposed by the holes 60a, 60b, 60c, 60d, 60e, 60f of FIG. 3a.

Figure 4:
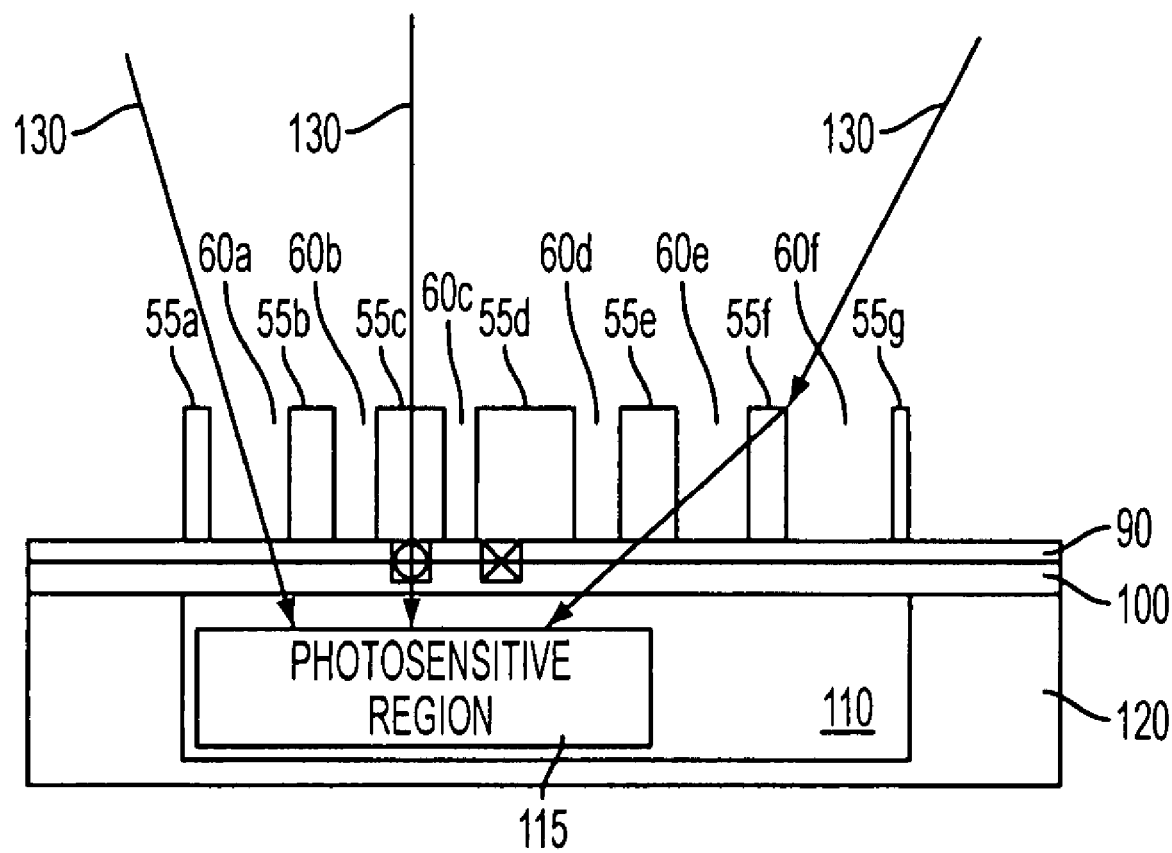
FIG. 4 is a cross-sectional view of the microlens of FIG. 3 above an imager pixel.

A cross-sectional view of the microlens 50 of FIG. 3a along the line Y-Y is shown in FIG. 4. Similar to the microlens of FIG. 1a, incident light 130 is directed toward a focal center 70 offset from the geometric center 80 of the microlens 50. Although two patterns are shown and described above, it is possible to achieve an off-center focus using other patterns by varying the pattern, the hole size, the hole density and hole spacing.

Figure 5C:
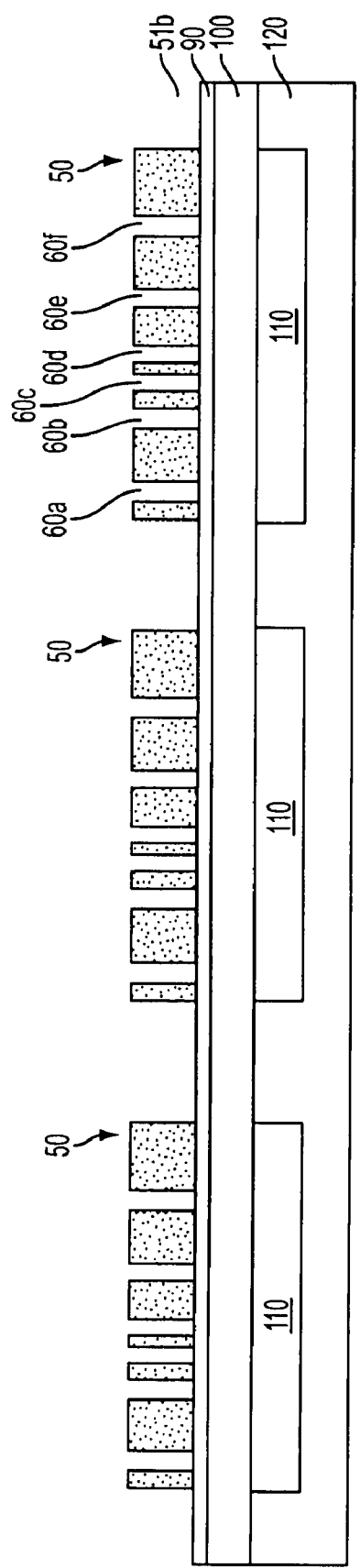
Figure 5D:
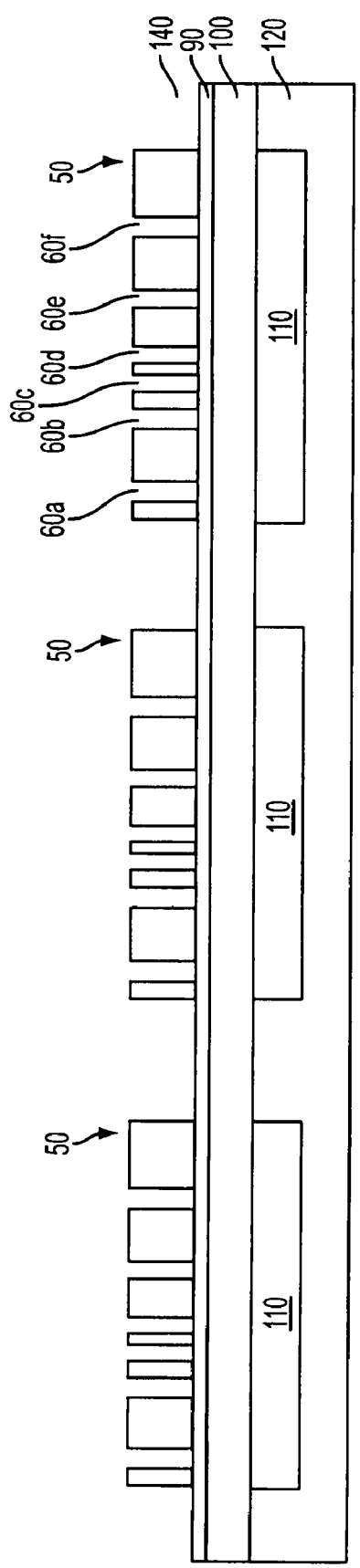

FIGS. 5a through 5d are cross-sectional views illustrating a method of manufacturing a microlens array 140 (FIG. 5d). It should be understood that although a photolithography process is discussed below, any conventional fabrication process may be used to manufacture the microlens array 140.

Figure 7B:
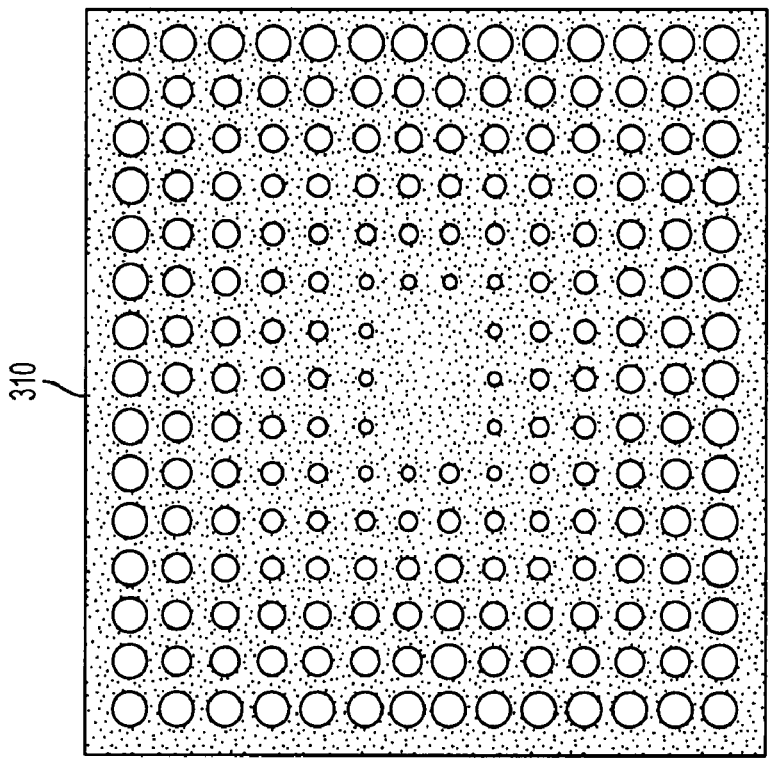
FIGS. 7a, 7b illustrate top down views of additional microlens embodiments.

First, as shown in FIG. 5a, photoresist 51a is layered over a passivation layer 90, intervening layers 100, and an array of imaging pixels 110 fabricated on semi-conductive substrate 120. The photoresist 51a layer can comprise any conventional photoresist material. As shown in FIG. 7b, a mask 55 is positioned over the photoresist 51a which is exposed to light. As part of the manufacturing process, the mask 55 is patterned to form a plurality of microlenses 50 in the microlens array 140 (FIG. 7d). Additionally, the mask 55 is patterned to form within each microlens 50 a plurality of holes 60a, 60b, 60c, 60d, 60e, 60f (FIG. 5d).

As shown in FIG. 5c, the exposed portions of the photoresist 51a are developed forming a patterned photoresist 51b. After developing, the photoresist 51b comprises a plurality of microlenses 50. Referring to FIG. 5d, the patterned photoresist 51b is hardened to form a microlens array 140 comprising a plurality of microlenses 50 with a flat upper surface, each microlens 50 comprising a plurality of holes 60a, 60b, 60c, 60d, 60e, 60f. The holes 60a, 60b, 60c, 60d, 60e, 60f may then be filled with a filler material having a different refractive index from the lens material, or filled with air or some other gas.

Figure 6C:
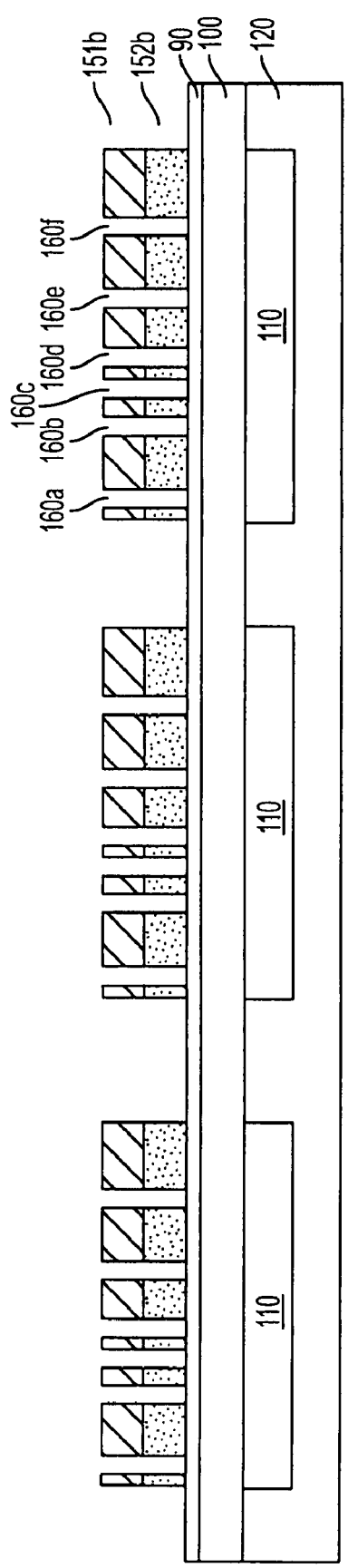
Figure 6D:
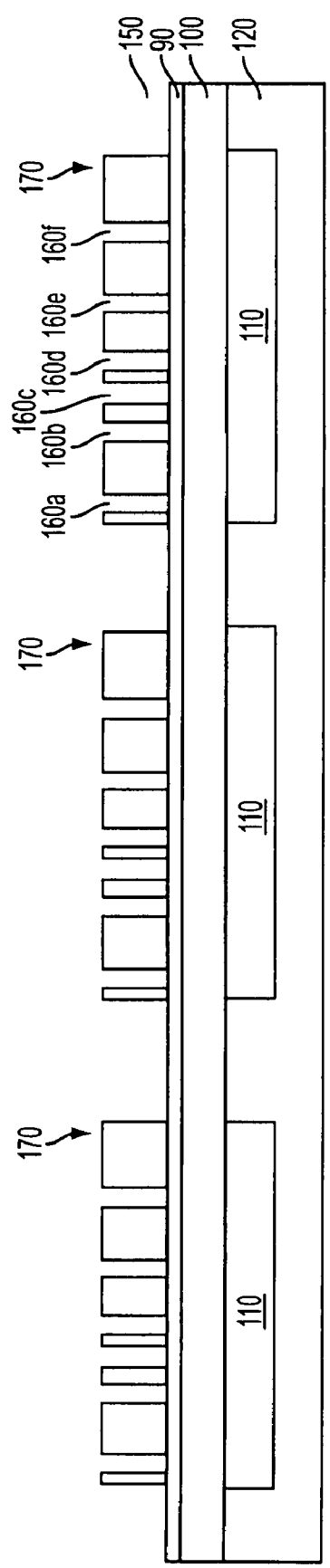

FIGS. 6a through 6d show another process of forming a microlens array 150. Here, a photoresist is used as an etching mask. Photoresist 151a is layered over lens material layer 152a (FIG. 6a). The lens material layer 152a may comprise nitride, oxide, or any inorganic or transparent material that can be patterned. As shown in FIG. 6b, a mask 155 is positioned over the photoresist 151a, which is exposed to light. The mask 155 is also patterned to expose portions of the photoresist 151a. As shown in FIG. 6c, the exposed portions of the photoresist 151a are developed forming a patterned photoresist 151b, which is then hardened and used as an etch mask for lens material layer 152a to form etched lens material layer 152b. As shown in FIG. 6d, the photoresist 151b is removed and the etched lens material layer 152b remains forming a microlens array 150 including a plurality of microlenses 170 with a flat upper surface comprising a plurality of holes 160a, 160b, 160c, 160d, 160e, 160f.

Figure 7A:
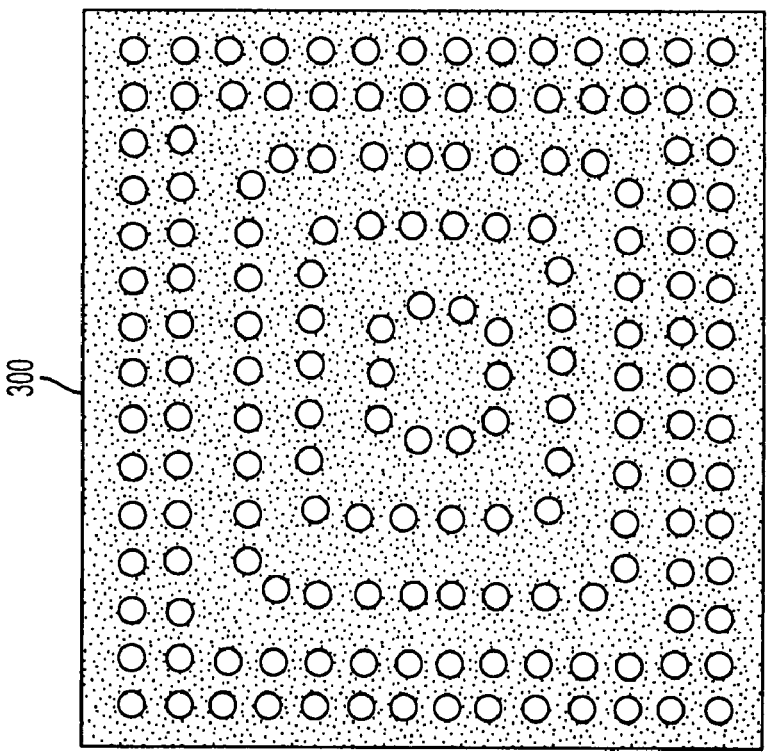

Although described as having an off-center focal point, the above described techniques may also be used to create a microlens having a focal point aligned with the geometric center of the microlens, as shown in the microlens patterns 300, 310 of FIGS. 7a-7b. FIG. 7a shows a pattern 300 similar to the pattern described in FIG. 1a, except that in pattern 300 the focal center and geometric center of the microlens are aligned. The pattern 300 is characterized by concentric rectangular patterns of holes wherein the hole size remains substantially the same but the hole spacing gradually decreases from the geometric center towards the microlens edge. FIG. 7b shows a pattern 310 similar to the pattern described in FIG. 3a except that in pattern 310 the focal center and geometric center are aligned. The pattern 310 is characterized by concentric rectangular patterns of holes wherein the hole density and spacing remain substantially the same but the hole size increases from the focal center of the microlens toward the edge of the microlens. It should be understood that the patterns 300, 310 and others may be created by varying hole pattern, spacing, size and density in various ways and using various pattern shapes.

Figure 8:
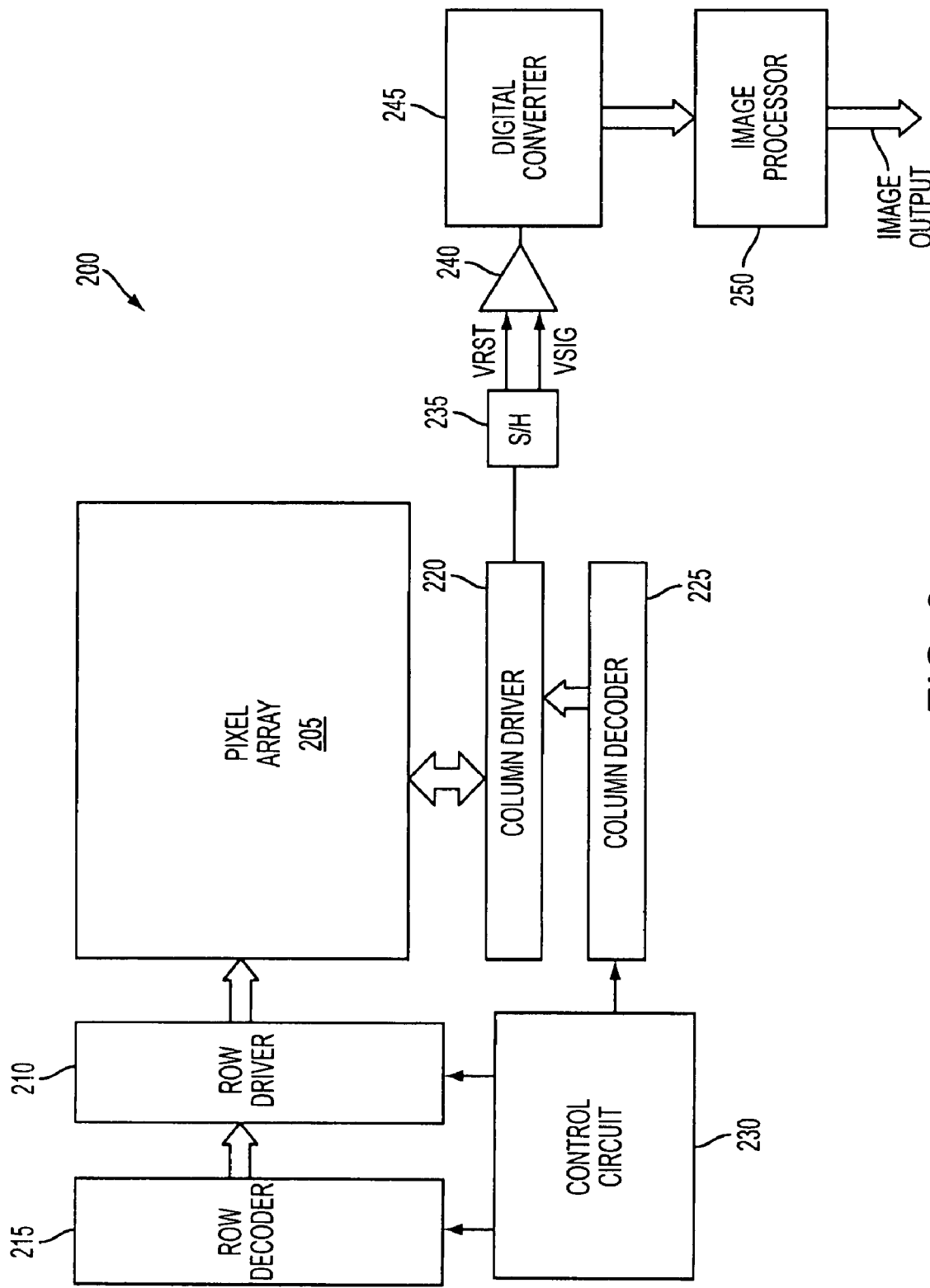
FIG. 8 illustrates a block diagram of a CMOS imager having a microlens array constructed in accordance with the invention.

FIG. 8 illustrates a block diagram of a CMOS imaging device 200 having a microlens array constructed in accordance with the invention. The imaging device 200 has a pixel array 205 having an overlying microlens array and comprising a plurality of pixels 110 with microlenses 50 over respective pixels which are constructed as described above. Row lines are selectively activated by a row driver 210 in response to row address decoder 215. A column driver 220 and column address decoder 225 are also included in the imaging device 200. The imaging device 200 is operated by the timing and control circuit 230, which controls the address decoders 215, 225. The control circuit 230 also controls the row and column driver circuitry 210, 220.

A sample and hold circuit 235 associated with the column driver 220 reads a pixel reset signal Vrst and a pixel image signal Vsig for selected pixels 25 of the pixel array 205. A differential signal (Vrst−Vsig) is produced by differential amplifier 240 for each pixel 25 and is digitized by analog-to-digital converter 245. The analog-to-digital converter 245 supplies the digitized pixel 25 signals to an image processor 250, which produces the digital pixel signal and forms and outputs a digital image.

Figure 9:
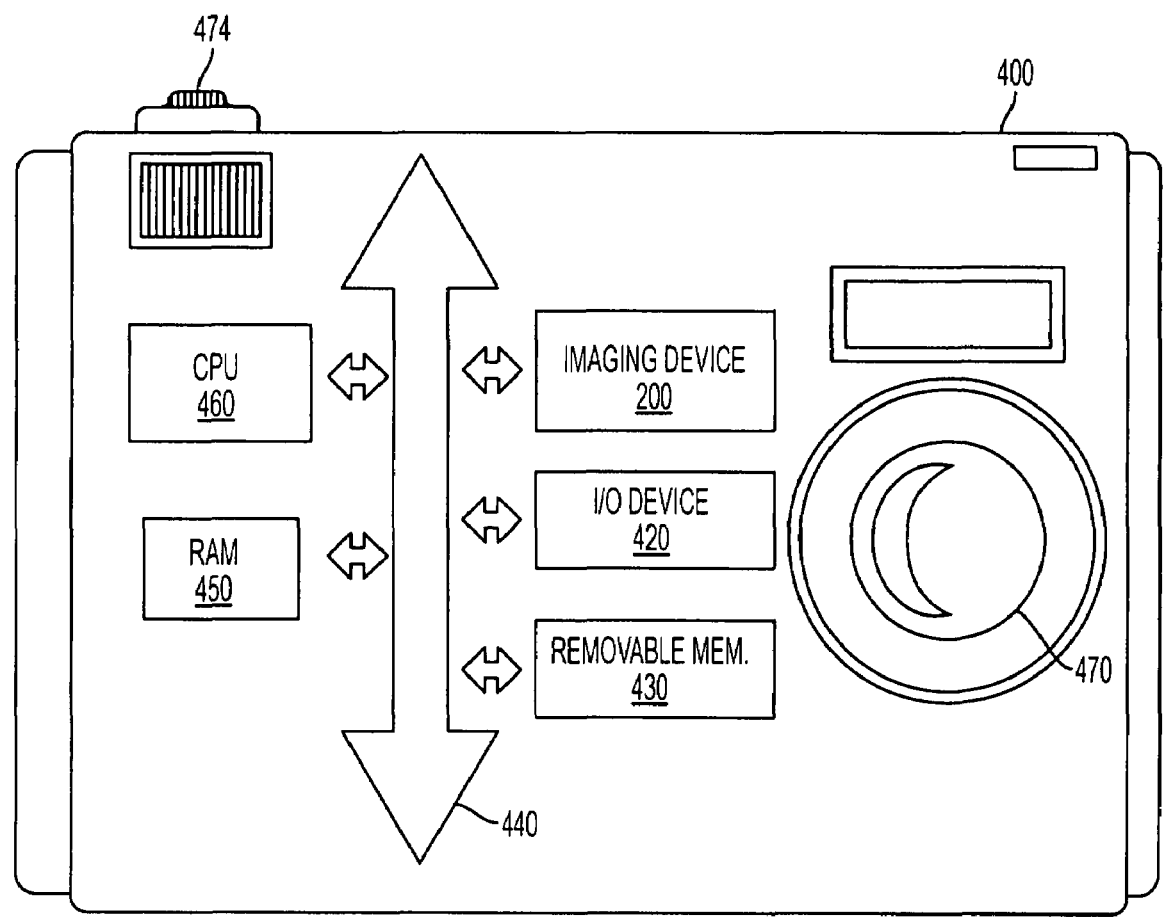
FIG. 9 shows a block diagram of a system having an imager constructed in accordance with an embodiment of the invention.

FIG. 9 illustrates a system 400, for example, a still or video digital camera system, utilizing an imaging device 200 including an array of pixels 110 comprising a microlens array constructed as described above. The imaging device 200 may receive control or other data from system 400. The imaging device 200 receives light on pixel array 205 through the lens 470 when shutter release button 474 is pressed. System 400 includes a control processor 460 having a central processing unit (CPU) that controls operations of the system and communicates with various devices over one or more buses or bridges 440. Some of the devices connected to the buses and/or bridges 440 provide communication into and out of the system 400; one or more input/output (I/O) devices 420, e.g., input setting devices, LCD display, and imaging device 200 are such devices. Other devices connected to the buses and/or bridges 440 provide memory, illustratively including a random access memory (RAM) 450, and one or more peripheral memory devices such as a removable memory 430. The imaging device 200 may be coupled to processor 460 for receiving control commands and providing image data. In addition to a still or video camera, examples of other processor based systems which may employ imaging device 200 include, without limitation, computer systems, scanners, machine vision systems, vehicle navigation systems, video telephones, surveillance systems, auto focus systems, star tracker systems, motion detection systems, and others.

While embodiments have been described in detail, it should be readily understood that the invention is not limited to the disclosed embodiments. Rather the embodiments can be modified to incorporate any number of variations, alterations, substitutions or equivalent arrangements not heretofore described. Accordingly, the invention is not limited by the foregoing description but is only limited by the scope of the attached claims.

What is claimed as new and desired to be protected by Letters Patent of the United States is:

1. A microlens structure, comprising:
    a microlens provided above a pixel, the microlens comprising a lens material having a plurality of holes creating a differential refractive index in the microlens such that incoming light is directed toward a focal point, wherein the lens material has a substantially flat upper surface which is farther from the pixel than a lower surface of the lens material and wherein the plurality of holes extend through the lens material from the upper surface to the lower surface.

2. The structure of claim 1, wherein the radii of the holes increase from an axis of the focal point of the microlens in a direction toward an edge of the microlens.

3. The structure of claim 1, wherein the focal point is offset a predetermined distance from an axis of a geometric center of the microlens.

4. The structure of claim 1, wherein the plurality of holes are formed in a pattern of concentric rectangles.

5. The structure of claim 4, wherein the concentric rectangles respectively increase in width from the focal point of the microlens to an edge of the microlens.

6. The structure of claim 1, wherein the plurality of holes are formed in a pattern such that the hole density increases from one section of the microlens to another section of the microlens.

7. The structure of claim 6, wherein the plurality of holes are formed such that each hole has approximately equal radii.

8. The structure of claim 1, wherein the plurality of holes are formed in a pattern such that the density of the holes is approximately equal across the microlens surface where the holes are provided.

9. The structure of claim 8, wherein the plurality of holes are formed such that hole radii vary from one section of the microlens to another section of the microlens.

10. The structure of claim 1, wherein the microlens has a substantially square shape.

11. The structure of claim 1, wherein the holes are filled with a filling having an index of refraction different from an index of refraction of the lens material.

12. The structure of claim 1, wherein the holes are filled with a filling having an index of refraction different which is greater than an index of refraction of the lens material.

13. A microlens structure comprising:
    a microlens provided above a pixel, the microlens comprising a plurality of holes formed in a pattern such that an average refractive index of the microlens cause incoming light to bend toward a focal point which lies on an axis offset a predetermined distance from the geometric center of the microlens, wherein the microlens further comprises a substantially flat upper surface and a fill material filling the plurality of holes, the upper surface of the microlens being farther from the pixel than a lower surface of the microlens and the plurality of holes extending through the microlens from the upper surface to the lower surface.

14. The structure of claim 13, wherein the plurality of holes have varying radii increasing from an axis of the focal point to an edge of the microlens.

15. The structure of claim 13, wherein the fill material is a gas.

16. An image sensor, comprising:
    a pixel array comprising a plurality of pixels, each having a photosensor;
    a microlens array formed over the pixel array, the microlens array comprising a plurality of microlenses respectively associated with a pixel, each having a substantially flat upper surface which is farther from the associated pixel than a lower surface of the microlens, and each comprising a plurality of holes formed in a pattern in a first material, the plurality of holes extending through the microlens from the upper surface to the lower surface, the holes being filled with a second fill material, the first material and second material each having a different respective refractive index, the pattern of holes producing a focal point in each microlens which lies on an axis offset from the geometric center of the respective microlens.

17. The image sensor of claim 16, wherein the fill material is air.

18. The image sensor of claim 16, wherein the pattern of openings comprise a plurality of holes of varying radii, wherein the radii increase from an axis of the focal point of the microlens to an edge of the microlens.

19. The image sensor of claim 16, wherein the pattern of openings comprise a plurality of holes of approximately equal radii, wherein the hole density increases from an axis of the focal point of the microlens to an edge of the microlens.

20. A camera system, comprising:

an imager connected to a processor, the imager comprising:

a substrate having a plurality of pixels formed thereon in an array, each pixel having a photosensor;

a microlens array formed above the pixels and comprising a plurality of microlenses for focusing light on a respective photosensor, each microlens including a plurality of holes formed in a pattern in a lens material, wherein the plurality of holes are filled with a second material and bend incoming light toward a focal point due to a differential refractive index between said lens material and second material, each microlens having a substantially flat upper surface which is farther from the respective photosensor than a lower surface of the microlens, the plurality of holes extending through the microlens from the upper surface to the lower surface; and a lens for focusing an image on said microlens array.

21. A method of fabricating a microlens array, comprising:

patterning a lens material to form a set of microlenses on a pixel array having at least one microlens comprising a plurality of holes in said lens material and a substantially flat upper surface which is farther from the pixel array than a lower surface of the lens material, the plurality of holes extending through the lens material from the upper surface to the lower surface and having a focal point lying on an axis offset from the geometric center of the microlens by a predetermined distance.

22. The method of claim 21, wherein the plurality of holes create a differential refractive index in the microlens which bends light towards the focal point.

23. The method of claim 22, wherein the plurality of holes are formed such that each have approximately equal radii.

24. The method of claim 22, wherein the plurality of holes are formed having varying radii.

25. The method of claim 22, wherein the plurality of holes are formed such that hole density changes from one section of the microlens to another section of the microlens.

* * * * *

UNITED STATES PATENT AND TRADEMARK OFFICE
CERTIFICATE OF CORRECTION

| | | |
|---|---|---|
| PATENT NO. | : 7,646,551 B2 | Page 1 of 1 |
| APPLICATION NO. | : 11/987868 | |
| DATED | : January 12, 2010 | |
| INVENTOR(S) | : Jin Li et al. | |

It is certified that error appears in the above-identified patent and that said Letters Patent is hereby corrected as shown below:

In the References Cited:

Column 2, Other Publications, "vvww.opticsexpress.orq/viewmedia.cfm?is=74372&seq=0" should read --www.opticsexpress.org/viewmedia.cfm?is=74372&seq=0--

In the Specification:

Column 1, line 48, "the microlens of FIG. 3" should read --the microlens of FIG. 3a--

Column 1, line 51, "microlens as shown in FIG. 1" should read --microlens as shown in FIG. 1a--

Column 1, lines 53-55, "microlens as shown in FIG. 1" should read --microlens as shown in FIG. 1a--

Column 2, lines 40-41, "such that the width of each concentric rectangle increase from the focal center" should read --such that the width of each concentric rectangle increases from the focal center--

Column 3, lines 5-6, "having the greatest photoconversion efficiency The various" should read --having the greatest photoconversion efficiency. The various--

Column 3, lines 27-28, "Light 130 entering closer to the edge of the microlens 50, will bend toward" should read --Light 130 entering closer to the edge of the microlens 50 will bend toward--

In the Claims:

Claim 12, line 20, "having an index of refraction different which is greater than" should read --having an index of refraction which is greater than--

Signed and Sealed this

Twenty-fourth Day of August, 2010

David J. Kappos
*Director of the United States Patent and Trademark Office*

UNITED STATES PATENT AND TRADEMARK OFFICE
CERTIFICATE OF CORRECTION

PATENT NO. : 7,646,551 B2 Page 1 of 2
APPLICATION NO. : 11/987868
DATED : January 12, 2010
INVENTOR(S) : Jin Li et al.

It is certified that error appears in the above-identified patent and that said Letters Patent is hereby corrected as shown below:

In the References Cited:

Column 2, Other Publications,
"vvww.opticsexpress.orq/viewmedia.cfm?is=74372&seq=0" should read
--www.opticsexpress.org/viewmedia.cfm?is=74372&seq=0--

In the Specification:

Column 1, line 48, "the microlens of FIG. 3" should read --the microlens of FIG. 3a--

Column 1, line 51, "microlens as shown in FIG. 1" should read --microlens as shown in FIG. 1a--

Column 1, lines 53-55, "microlens as shown in FIG. 1" should read --microlens as shown in FIG. 1a--

Column 2, lines 40-41, "such that the width of each concentric rectangle increase from the focal center" should read --such that the width of each concentric rectangle increases from the focal center--

Column 3, lines 5-6, "having the greatest photoconversion efficiency The various" should read --having the greatest photoconversion efficiency. The various--

Column 3, lines 27-28, "Light 130 entering closer to the edge of the microlens 50, will bend toward" should read --Light 130 entering closer to the edge of the microlens 50 will bend toward--

This certificate supersedes the Certificate of Correction issued August 24, 2010.

Signed and Sealed this

Twenty-eighth Day of September, 2010

David J. Kappos
*Director of the United States Patent and Trademark Office*

In the Claims:

Claim 12, Column 6, line 20, "having an index of refraction different which is greater than" should read --having an index of refraction which is greater than--